United States Patent
Fujiwara et al.

(10) Patent No.: US 8,048,731 B2
(45) Date of Patent: Nov. 1, 2011

(54) METHOD FOR REDUCING LOW FREQUENCY NOISE OF TRANSISTOR

(75) Inventors: Mikio Fujiwara, Tokyo (JP); Masahide Sasaki, Tokyo (JP); Hiroshi Matsuo, Tokyo (JP); Hirohisa Nagata, Kanagawa (JP)

(73) Assignees: National Institute of Information and Communications Technology, Tokyo (JP); National Institutes of Natural Sciences, Tokyo (JP)

( * ) Notice: Subject to any disclaimer, the term of this patent is extended or adjusted under 35 U.S.C. 154(b) by 223 days.

(21) Appl. No.: 12/406,297

(22) Filed: Mar. 18, 2009

(65) Prior Publication Data

US 2010/0237934 A1 Sep. 23, 2010

(51) Int. Cl.
  *H01L 21/335* (2006.01)
(52) U.S. Cl. ........ 438/186; 438/795; 257/256; 257/272; 257/E21.4
(58) Field of Classification Search .................. 438/186; 257/256, 272, 615, 295, E21.4
  See application file for complete search history.

(56) References Cited

U.S. PATENT DOCUMENTS

| 4,144,591 | A | * | 3/1979 | Brody | 365/228 |
| 4,786,809 | A | * | 11/1988 | Norton | 250/352 |
| 5,907,168 | A | * | 5/1999 | Childs | 257/256 |
| 6,773,936 | B2 | * | 8/2004 | Fujiwara et al. | 438/14 |
| 2003/0183750 | A1 | * | 10/2003 | Akiba | 250/214.1 |

OTHER PUBLICATIONS

M. Fjuiwara, M. Sasaki and M. Akiba; Reduction method for low-frequency noise of GaAs junction field-effect transistor at a cryogenic temperature; Applied Physics Letters; vol. 80, No. 10, Mar. 11, 2002, pp. 1844-1846.

Mikio Fujiwara and Masahide Sasaki; Performance of GaAs JFET at a Cryogenic Temperature for Application to Readout Circuit of High-Impedance Detectors; IEEE Transactions on Electron Devices, vol. 51, No. 12, Dec. 2004, pp. 2042-2047.

A. J. Seeds and J. R. Forrest, Reduction of FM Noise in IMPATT Oscillators by Optical Illumination; Electronics Letters, vol. 17, No. 23, Nov. 12, 1981, pp. 865-866.

P. Chakrabarti; Noise Behavior of an Optically Controlled GaAs MESFET; Journal of Lightwave Technology, vol. 22, No. 2, Feb. 2004, pp. 534-542.

Enrico Prati and Marco Fanciulli; Effect of the triplet state on the random telegraph signal in Si n-MOSFETs; Physical Review B 74, 033309 (2006), pp. 1-4.

* cited by examiner

*Primary Examiner* — Mary Wilczewski
*Assistant Examiner* — Toniae Thomas
(74) *Attorney, Agent, or Firm* — McGlew and Tuttle, P.C.

(57) ABSTRACT

A method for reducing low frequency noise of a transistor operable at cryogenic temperatures includes a first step in which the transistor is illuminated with a light in a state that the transistor is activated and flowed current by supplying a power at a predetermined temperature, and a second step in which the transistor is operated at the predetermined temperature after the illumination of the light.

6 Claims, 6 Drawing Sheets

METHOD FOR REDUCING LOW FREQUENCY NOISE OF TRANSISTOR

BACKGROUND OF THE INVENTION

1. Field of the Invention

The present invention relates to a method for reducing low frequency noise of a transistor operating at cryogenic temperatures, and a reading-out circuit, and particularly, to a method for reducing low frequency noise of transistor operating at cryogenic temperatures, which is allowed to be operable with low noise by illuminating light to the transistor operating at the cryogenic temperatures, and a reading-out circuit.

2. Description of the Related Art

A transistor operating at cryogenic temperatures is used for a reading-out circuit of a cooled highly-sensitive photodetector, and the like, and the noise induced by the reading-out circuit frequently determines a limit of the optical detection. In the present invention, the noise of the reading-out circuit can be reduced, and an extremely-high sensitive photo-detecting technique can be realized.

An active noise reducing method for reducing the transistor operating at the cryogenic temperatures is limited. For example, the following is the noise reducing method which has been previously found by the present inventor. While drain current is flowing in the transistor, the operating temperature is increased up to the temperature at which a noise spectrum is changed, and is again cooled to the original operating temperature. Thereby, the noise can be reduced. Such a transistor operating at the cryogenic temperatures is, for example, disclosed in Japanese Patent No. 3598377.

However, when the transistor, in which the noise needs to be reduced, is included in an integrated circuit, this method brings such a disadvantage that other transistors are also affected by a thermal cycle. For this reason, it is difficult to apply the optimum noise reducing method to each transistor whose gate size and operating condition are different from those of other transistors. Furthermore, since a load to a system is increased by increasing the operating temperature, this method has been able to be applied to limited cases.

SUMMARY OF THE INVENTION

An object of the present invention is to provide a method for reducing low frequency noise of a transistor operating at cryogenic temperatures, in which a low noise operation is enabled by illuminating light to the transistor operating at the cryogenic temperatures.

Another object of the present invention is to provide a reading-out circuit, in which the low noise operation is enabled by illuminating light to the transistor operating at the cryogenic temperatures.

A method for reducing low frequency noise of a transistor operable at cryogenic temperatures includes illuminating the transistor with a light in a state that the transistor is activated and flowed current by supplying a power at a predetermined temperature, and operating the transistor at the predetermined temperature after the illumination of the light.

A reading-out circuit includes a transistor operable at cryogenic temperatures, the transistor being illuminated with a light in a state that the transistor is activated and flowed current by supplying a power at a predetermined temperature, and operated at the predetermined temperature after the illumination of the light, and a signal-processing circuit processing an output of the transistor.

DETAILED DESCRIPTION OF THE PREFERRED EMBODIMENTS

Figure 1A:
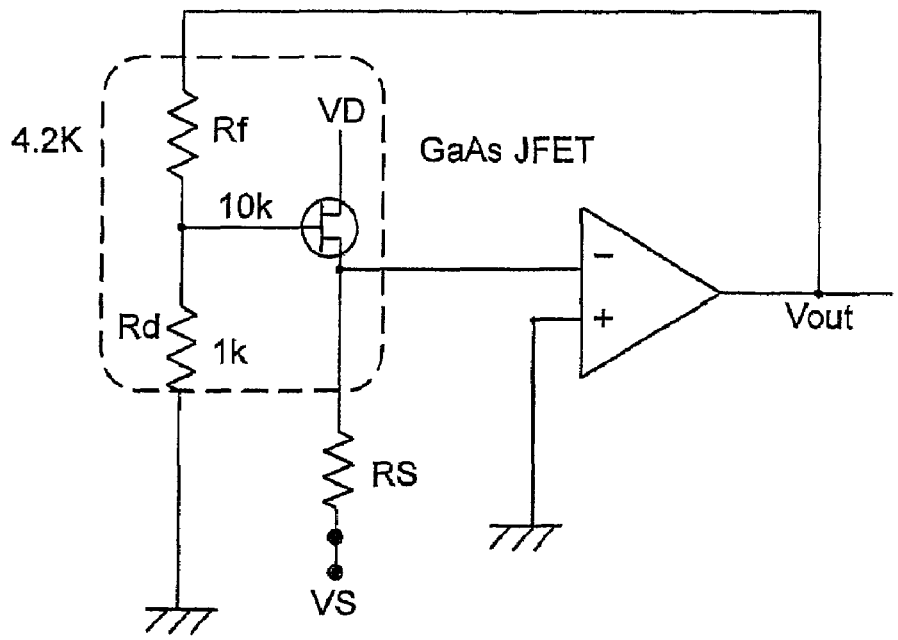
FIG. 1A shows a circuit for noise measurement in a GaAs JFET.

The background and summary of the present invention which discussed in this specification is as follow.

We demonstrated optical control low frequency noise in n-type GaAs junction field effect transistors (JFETs) at cryogenic temperatures. At 4.2 K, a 6 dB decrease and a 10 dB increase in noise at 1 Hz were observed when the JFET (band gap: 1.51 eV) was illuminated by light with wavelengths of 1650 nm and 1550 nm, respectively, for a drain voltage of 0.5 V and a drain current of 0.25 µA. On the other hand, the wavelength with the noise reduction effect decreased to 1550 nm at 30 K. These results mean the trap charges at an energy level of approximately 0.75±0.1 eV affect the carrier tunnel probability and the behavior of the low frequency noise.

There is a continued request for transistors that are able to operate with very low noise at cryogenic temperatures, i.e. below liquid helium temperature. Furthermore, low power dissipation and low gate leakage current are necessary for transistors to be used to read out signals of high-impedance photodetectors. Si junction field effect transistors (JFETs) are generally applied as transimpedance amplifiers because of their low noise characteristics.

However, an Si JFET must be warmed up to near liquid nitrogen temperature for avoiding a freeze-out phenomenon. This make it inconvenient for constructing a large format photodetector array, because it should be necessary to separate work stages of photodetectors and read out circuits. Meanwhile, for high sensitivity scanning, a charge integration amplifier (CIA) is widely used because it can increase the signal to noise ratio by long exposure. However, low noise at low frequency is absolutely imperative in such a CIA. At low frequency, 1/f and random telegraph signal (RTS) noises are dominant.

Therefore, development of a cryogenic FET with low noise at low frequency is extremely necessary for high sensitive observation. Moreover, methods for reducing the low frequency noise are also desirable. Suppression of RTSs in metal-oxide-semiconductor FETs (MOSFETs) by using a strong magnetic field perpendicular to the MOSFET has been reported in "Prati E., Fanciulli M., and Sampietro M., Effect of the triplet state on the random telegraph signal in Si-MOSFETs, Phys. Rev. B, 2006; 74:033309 1-4". But a MOS FET is suffering from the kink phenomenon at cryogenic temperature. A GaAs JFET is a promising candidate for preamplifiers of the photodetectors that have extremely high impedance at cryogenic temperatures because of no kink phenomenon, hysteresis in I-V characteristics below 4.2 K, a low gate leakage current and a low dielectric polarization characteristics. In our previous study on the GaAs JFET, low noise, i.e., 0.5 $\mu V/Hz^{1/2}$ at 1 Hz was achieved by the thermal curing (TC). (See "Fujiwara M., and Sasaki M., and Akiba M., Reduction method for low-frequency noise of GaAs junction field-effect transistor at a cryogenic temperature, Appl. Phys. Lett. 2002; 80: 1844-1846", and "Fujiwara M., and Sasaki M., Performance of GaAs JFET at a cryogenic temperature for application to readout circuit of high-impeadance detectors, IEEE Trans. Electron Devices, 2004; 51:2042-2047") TC is especially effective to reduce RTS noise, and that technique involves thermal cycles in which the operating temperature is increased from 4.2 to 55 K, and then decreased back to 4.2 K under a certain drain current flow.

However, strong magnetic fields or changing operating temperature increase the burden of a cryogenic system. Moreover, conditions required for reducing the RTSs may differ from sample to sample because of the difference in operating conditions and/or carrier trap levels. Therefore, curing techniques that focus on a single FET are desirable for such an integrated circuit. We reviewed the trap level that affects RTSs. In our previous study ("Fujiwara M., and Sasaki M., and Akiba M., Reduction method for low-frequency noise of GaAs junction field-effect transistor at a cryogenic temperature, Appl. Phys. Lett. 2002; 80: 1844-1846"), the trap level was estimated to be 0.5±0.2 eV, and its position was located near the drain electrode taking into consideration the amplitude of the RTS and the size of the non-conductive region produced by traps. If a modulation is added to the capture/emission probability of the carrier by the traps, the behavior of the RTSs and 1/f noise will change. During TC, a thermal process of the carriers in the traps is significant. Thus, activation of carriers in traps can be done by the illumination. In previous studies "Seeds A. J. and Forrest J. R., Reduction of FM noise in IMPATT oscillators by optical illumination, Elec. Lett. 1981; 17:865-866", the noise decreases in a GaAs impact avalanche transit time (IMPATT) oscillator under illumination by 632.8 nm light has been reported.

Further, a theoretical analysis was performed on the GaAs metal-semiconductor FET (MESFET), and it was concluded that the degradation of noise behaviors was caused by illumination ("Chakrabarti P., Tiwari B. N., and Kumar S., Noise behavior of optically controlled GaAs MESFET, J. Lightwave Tech. 2004; 22:534-542"). In these two papers, light that had higher energy than band gaps were used.

In contrast to them, we use in the present invention photon whose energy is less than band gap. In the present invention, we report noise behaviors and fluctuations in the drain current of the GaAs JFET at cryogenic temperatures with illumination of infrared light with energy less than band gap energy.

According to the present invention, illumination can affect the deep level traps in the GaAs JFET. As described later, we found that the noise originating from deep trap levels is reduced by use of infrared light, so that optical control of the noise can be widely applied to cryogenic circuits because of the simplicity in focusing and optimization. In the present invention, we will describe experimental conditions, introduce results at 4.2 K, and show the new results at 30 K in "experiments and their results" described bellow. Finally, in the present invention, we will discuss the effect of the illumination to the GaAs JFET in "discussion" described later.

Now, we will describe our experiments and their results. The circuit used for measuring the input referred noise of the JFET is shown in FIG. 1A. In this circuit, a source follower connection was used, and the framed area was cooled to cryogenic temperatures (4.2-30 K). In this circuit, the drain current was determined by a source resistance, and the gate voltage was amplified 11 times and applied to the low noise amplifier (Stanford Research System SR560) at room temperature. The noise spectra and output waveforms were measured by using a multi-purpose Fast Fourier Transform analyzer (Ono Sokki CF5220Z).

Figure 1B:
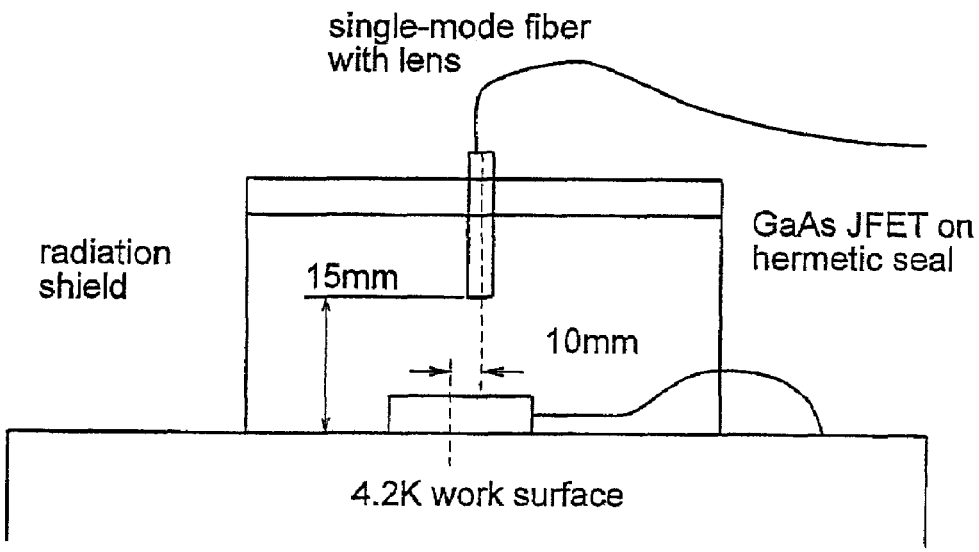
FIG. 1B shows a schematic diagram of an illumination test.

The layout sketch of the illumination test is shown in FIG. 1B. The GaAs JFET was bonded to a hermetic seal and fixed onto a work surface. The distance between the center line of a fiber with a lens and the GaAs JFET was 10 mm, and that between the work surface and the fiber was 15 mm. Laser diodes (Nettest ECL and Santec ECL-200) were used as infrared light sources (wavelength: 1310-1650 nm). Illumination conditions (power/time) were −4 dBm/125 s for 1650 nm light and 0 dBm/50 s for the others. Under these conditions, a sufficient number of photons was added into the JFET without causing any optical damage. During illumination, no temperature increase was observed on the work surface. Therefore, the temperature fluctuation was estimated to be below 10 mK.

We tested a depletion-mode SONY GaAs JFET with a gate width of 5 µm and a gate length of 1 µm. The drain voltage was fixed at 0.5 V, and the drain current was adjusted from 0.25 µA to 0.5 µA in order to confirm a dependence of the illumination test on operating conditions at 4.2 K. Moreover, illumination influences on noise behaviors were measured at 30 K. These conditions were selected to the JFET in the saturated region of the I-V characteristics. Hereafter, we will describe data obtained from one of typical JFETs. In the illumination tests, the change in output voltage reached a plateau within a few seconds. Noise spectra data were averaged for 100 measurements, and data acquisitions were completed in 15 min, after varying experimental conditions.

Figure 2A:
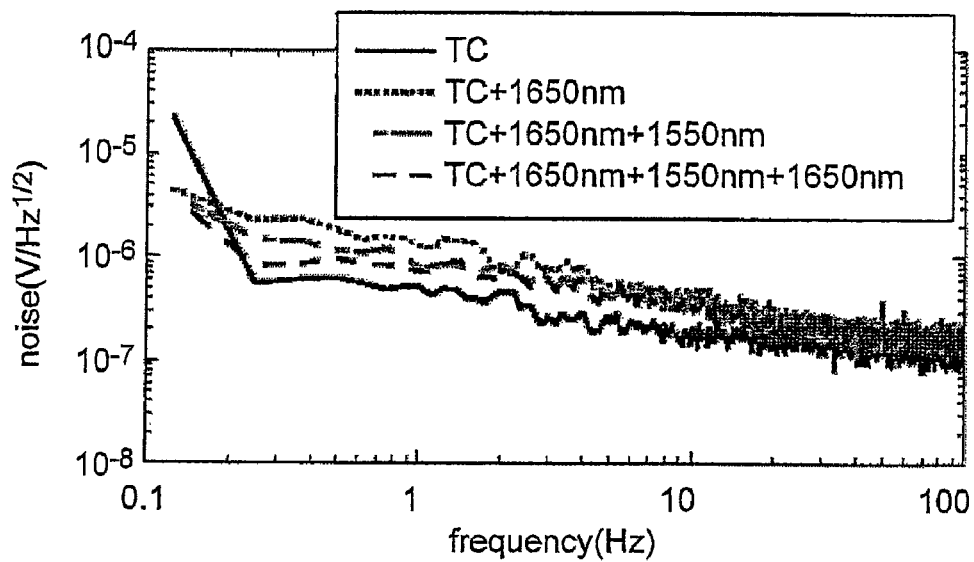
FIG. 2A shows noise spectra of the GaAs JFET at 4.2 K with thermal curing (TC) and illuminated wavelengths of 1650, 1550, and 1650 nm (in the same sequence) with the drain voltage being 0.5 V and the drain current 0.5 µA.
Figure 2B:
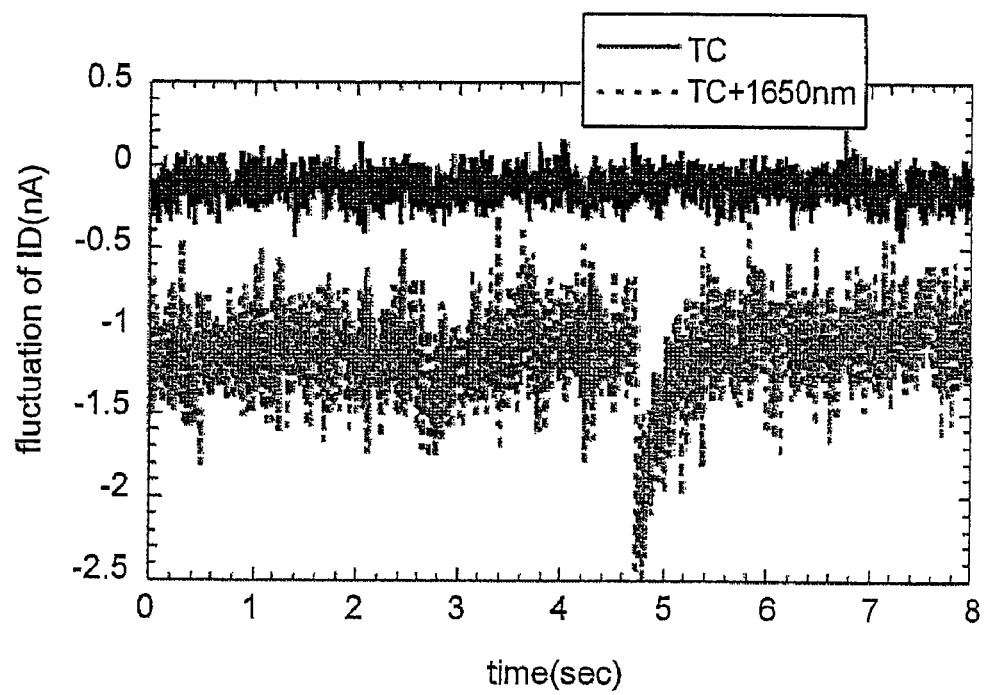
FIG. 2B shows fluctuation in drain current of the GaAs JFET with TC and illumination at wavelength of 1650 nm with offsets being added in for the easy view.

At first, we clarified the dependence of noise behavior on an illumination wavelength for optical control at 4.2 K. During the first trial, the drain current was adjusted to 0.5 µA, and the initial gate voltage was 26 mV. FIG. 2A shows noise spectra of the GaAs JFET with TC (curing temperature: 85 K), illuminated at wavelengths of 1650 nm, 1550 nm, and 1650 nm, in the same sequence. As shown in FIG. 2A, the low frequency noise increased by 7.8 dB at 1 Hz accompanied by a gate voltage decrease of 18 mV after irradiation with 1650 nm light. FIG. 2B shows the fluctuations in the drain current of the GaAs JFET before and after illumination with 1650 nm light. A large fluctuation in the drain current came up after illumination with 1650 nm light. On the other hand, a 4.2 dB noise reduction and 6.8 mV gate voltage increases were observed for illumination at 1550 nm. Finally, 1650 nm illumination test was leading to a small noise decrease of 0.6 dB. In this trial, the gate voltage increased by 0.6 mV. The 1650 nm illumination test gave a different result, and a hysteretic behavior in response to illumination was observed.

Noise spectra and gate voltages remained constant for at least one hour. In some cases, we confirmed that noise behaviors remained unchanged even three hours after illumination. Furthermore, in a 1310 nm illumination test, a large increase in the noise and a decrease in the gate voltage were measured. In conclusion, light with a wavelength of approximately 1550-1650 nm changed noise levels under the abovementioned operating condition, and noise levels showed hysteretic behavior in response to illumination. We have assumed that charge states of the deep level traps were related to these phenomena. The deep level traps correspond to wavelengths shorter than wavelengths corresponding to an acceptor level or a donor level of the semiconductor. Thus, the lights are used which have the wavelengths shorter than wavelengths corresponding to an acceptor level or a donor level is used.

Figure 3A:
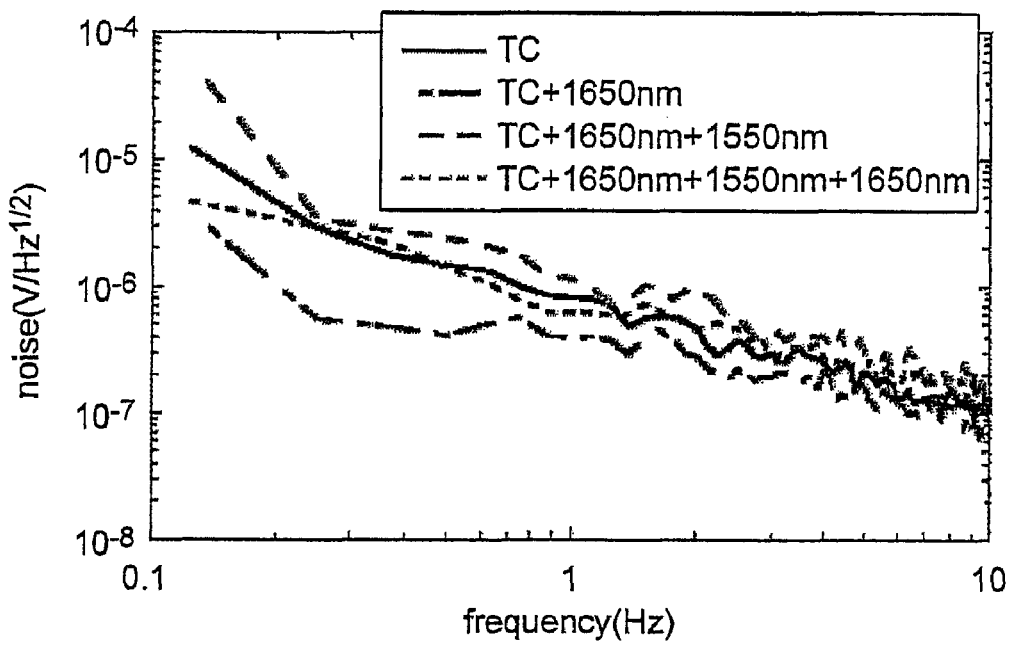
FIG. 3A shows noise spectra.
Figure 3B:
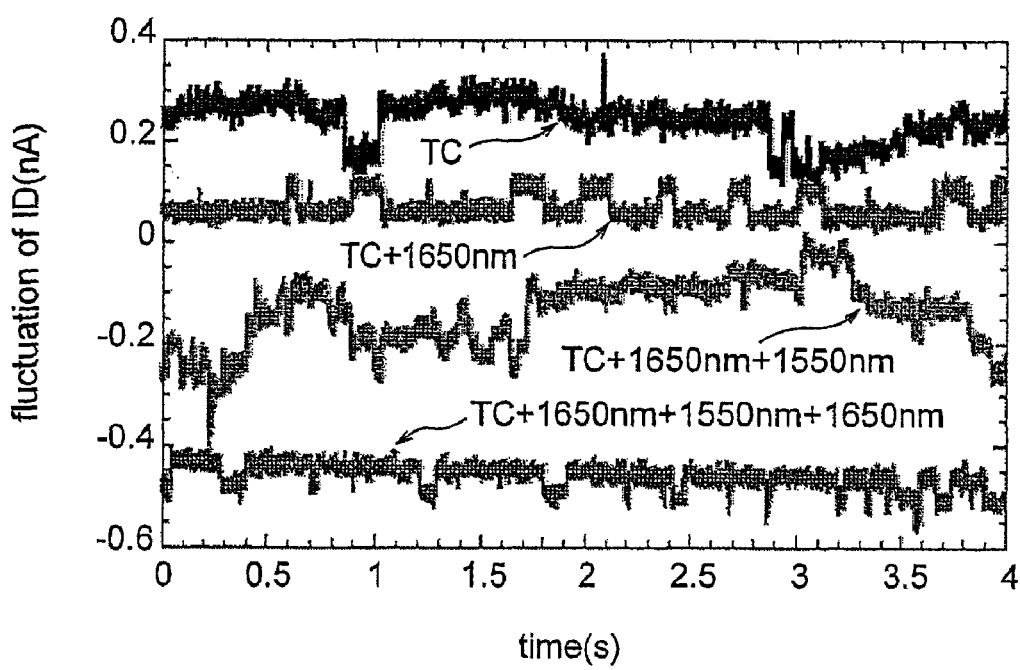
FIG. 3B shows fluctuation in drain current of the GaAs JFET at 4.2 K with TC and sequential illumination at wavelengths of 1650, 1550, and 1650 nm where offsets are added for the easy view and the drain voltage was 0.5 V and the drain current was 0.25 µA.

Next, we verified the effect of illumination under another operation condition because a variation in the band bending around the drain electrode leads to a variance in noise behaviors at 4.2 K. In this trial, the drain current was set at 0.25 μA and the initial gate voltage was −1.7 mV. FIGS. 3A and 3B show noise spectra and fluctuations in the drain current of the GaAs JFET, respectively, in the same sequence shown in FIG. 2A (with TC, and illumination with light of wavelengths 1650 nm, 1550 nm, and 1650 nm, in the same sequence).

First, the noise reduction effect with the 1650 nm illumination was observed below 10 Hz, and 1/f noise decreased drastically. A reduction of 6.7 dB was obtained, and a low noise of <400 nV/Hz$^{1/2}$ at 1 Hz was achieved after illumination with 1650 nm light. It is apparent that the amplitude of the fluctuation in the drain current was reduced. In particular, low frequency fluctuation flattered, as shown in FIG. 3B. After irradiation, the gate voltage increased by 1.2 mV.

In contrast, when 1550 nm light was used for illumination, low frequency noise increased. At 1 Hz, an increase of 9 dB was measured compared with previous state and large and long period fluctuations in the drain current reappeared, as shown in FIGS. 3A and 3B. Further, a decrease of 0.9 mV in the gate voltage was also measured. To confirm the noise reduction effect of 1650 nm illumination, the illumination process was repeated and we obtained a noise reduction of 5.4 dB at 1 Hz. Simultaneously, an increase of 0.2 mV in the gate voltage was measured. Under this condition, 1650 nm illumination showed a clear noise reduction effect at 4.2 K.

Figure 4A:
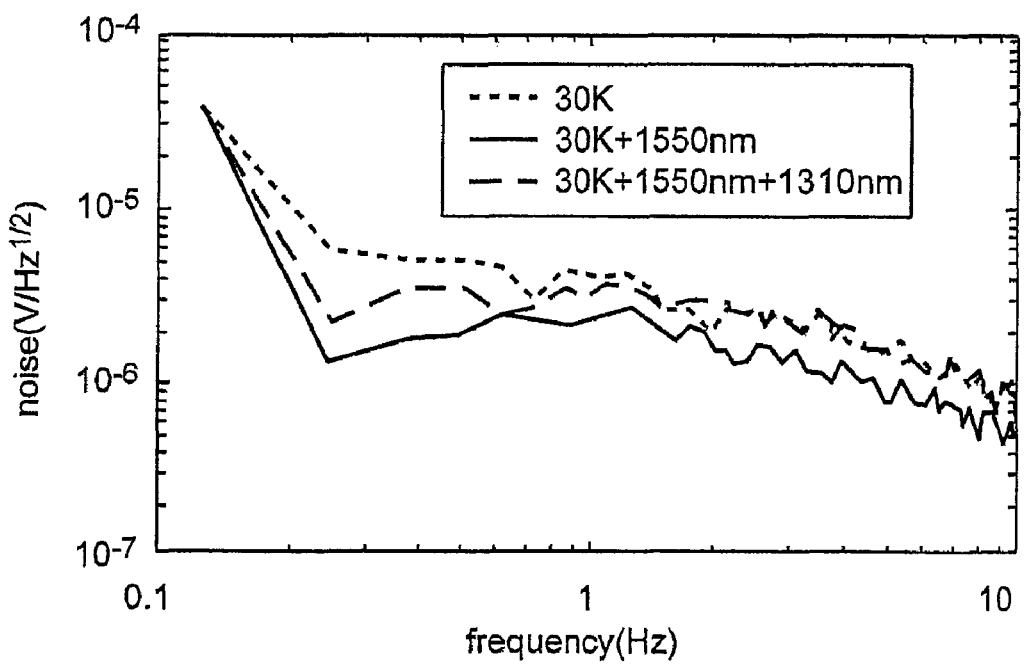
FIG. 4A shows noise spectra of the GaAs JFET at 30 K and illuminated wavelengths of 1550, 1310, and 1550 (in the same sequence)

We checked this noise reduction effect at the operation temperature of 30 K. The drain current was set at 0.25 μA. FIG. 4A shows noise spectra of no-illuminated state, illumination at wavelengths 1550 nm and 1310 nm. Noise spectra show plateau around 1 Hz. During illumination with 1550 nm light was illuminated, the low frequency noise at 1 Hz decreased by 5.3 dB. On the other hand, noise increased by 2.2 dB after illumination with 1310 nm light. At 4.2 K, 1650 nm light has the noise reduction effect at the drain current of 0.25 μA.

Figure 4B:
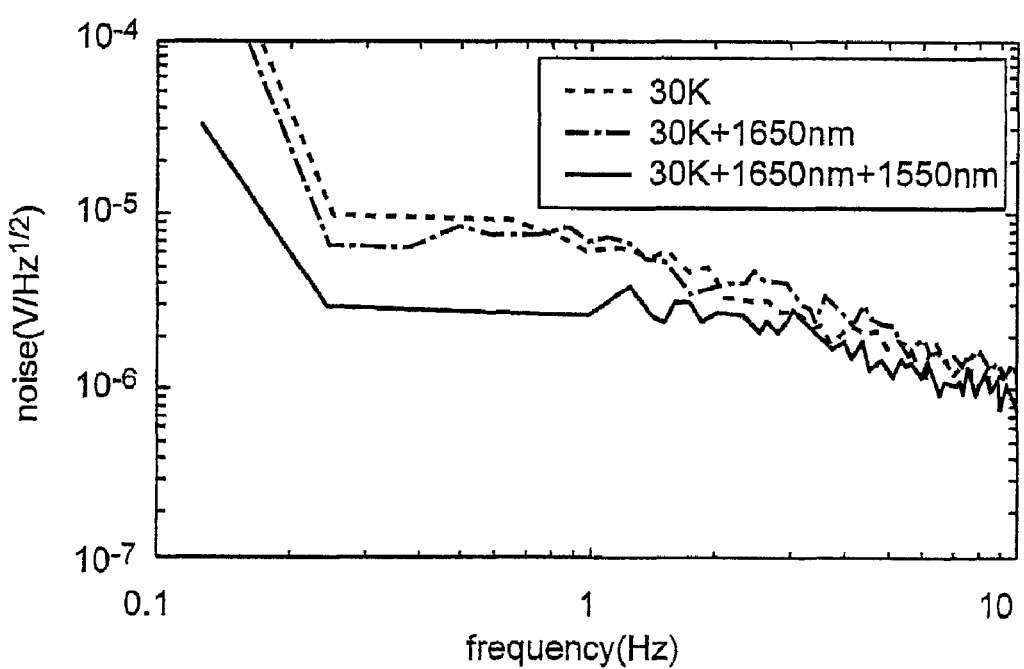
FIG. 4B shows noise spectra at 30 K and illuminated wavelengths of 1650 and 1550, with the drain voltage being 0.5 V and the drain current being 0.25 µA.

The illumination using 1650 nm light at 30 K is shown in FIG. 4B. In this case, the noise level increased slightly (1.6 dB). When 1550 nm light was illuminated to this state, the noise decreased by 8.3 dB and the noise reduction effect was observed. In conclusion, the wavelength with the noise reduction effect became shorter when the operating temperature increased to 30 K. Moreover, the width of wavelengths with noise reduction effect was estimated to be approximately ±0.1 eV.

We discuss on the above experiments and their results as bellow. To interpret the illumination influence on noise behaviors of the GaAs JFET, we used a simple assumption that 1650 nm and 1550 nm illumination excited negative and/or positive electric charge traps with activation energies of approximately 0.75 eV and 0.8 eV, respectively. In our illumination tests, the noise reduction effect was always accompanied with an increase in the gate voltage. On the other hand, when a decrease of the gate voltage was measured, the noise level increased. The gate voltage increasing implied that the illumination caused the channel to be narrowed, which also occurred during the cooling stage in TC.

In our previous study, we suspected that the RTS was mainly caused by carrier tunneling rather than by thermal excitation, because the switching process of the RTS was independent of the operating temperature below 35 K. Thus, the trap that is at the same energy level as the conduction band should be considered. Moreover, traps is located in a non-conductive area near the drain electrode, that is made by the single trapped charges, and makes the RTSs which is the cause of the amplitude of the RTSs. We interrupted the carrier tunneling, noise suppressing and increasing in the gate voltage as follows.

Figure 5:
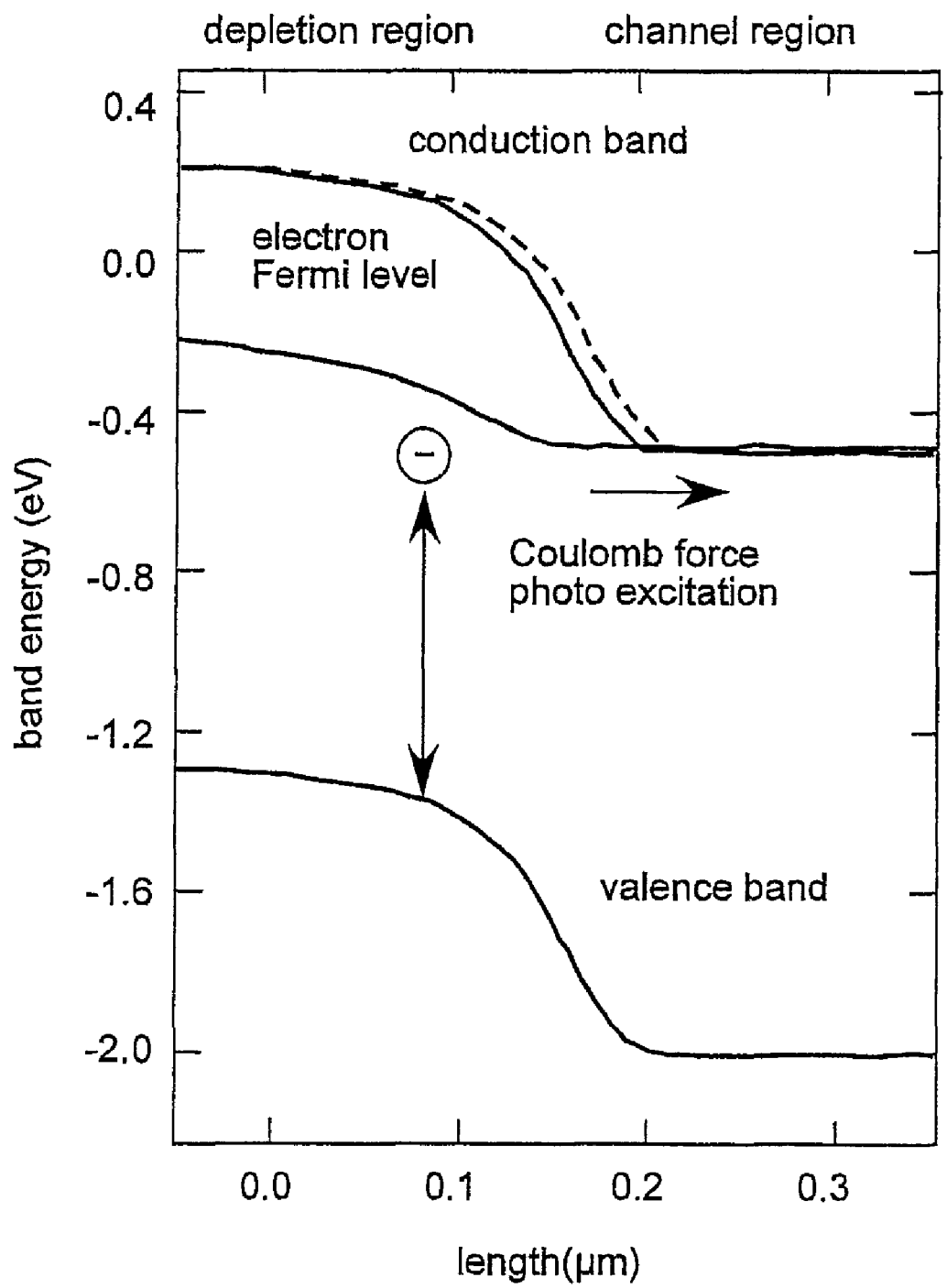
FIG. 5 shows a simulated band diagram near the drain electrode.

The schematic diagrams of the energy band near the drain electrode roughly estimated by a device simulator are shown in FIG. 5. On the basis of the similarity of this carrier tunneling through a pn junction, we assumed a carrier tunneling probability P to be $$P \propto \exp\left\{-\frac{4\sqrt{2m^*}\,(Eg_{trap})^{3/2}}{3e\hbar F_{local}}\right\}, \quad (1)$$

where $Eg_{trap}$ denotes the activation energy of the trap state, e denotes the elemental electric charge, $m^*$ denotes the electron effective mass, $F_{local}$ denotes the electrical field near the trap state, and $\hbar$ denotes $h/2\pi$ (h; plank's constant). Further, the total occurrence of the RTSs is given as $\Sigma P\, N_{trap}$. Here, $N_{trap}$ is the total number of traps that produce the RTSs. In this equation, the parameters that are affected by illumination are $F_{local}$ and $N_{trap}$. Taking into account changing gate voltages, at least, $F_{local}$ was modulated by illumination. The Coulomb force of a trap moves a channel away when the trap has a negative charge, as shown the dashed line in FIG. 5. After illumination, the distance between traps and the channel increases. As a result, the tunneling probability changes and the noise level decreases. Moreover, the channel narrowing and the increase of the gate voltage can be explained.

On the other hand, if a positive charge is produced by illumination, a phenomenon opposite to that mentioned above will be observed. Considering such hysteresis phenomena, we suggest that the effect of infrared illumination depends on the initial state of the trap and the band bending. According to results of illumination test at 30 K, the trap (hole) charges at an energy level of approximately 0.75±0.1 eV affect the carrier tunnel probability and the behavior of the low frequency noise. By putting together TC experiments and infrared irradiation tests, we assume that it is possible that $N_{trap}$ is directly modulated by infrared light.

The experiments, their results and discussion, which are above described, are summarized as bellow. We show that the optically induced shift of noise level were demonstrated in the GaAs JFET by using infrared light whose energy corresponds to the activation energy of a deep level trap at cryogenic temperatures. Our results imply that deep level trapped charges have influence on low frequency noises, and we succeeded in suppressing them by illuminations. Since laser illuminations can be focused on a smaller area than a single JFET, noise levels of JFETs in integrated circuits can be conveniently controlled even if trap levels or gate size are different from samples to samples. We show the optimization of the band bending around the drain electrode will bring low noise of the GaAs JFET.

Accordingly, the present invention may apply to such a transistor that has a band bending, which is shown in FIG. 5 and may be formed in a junction or a depletion layer of the transistor. Thus, the controlling for the noise level by the light illumination of the photons whose energies (h v) are less than a band gap energy may apply to a transistor other than the GaAs JFET. For example, the present invention may apply to a transistor such as a Si JFET, a various types of a MOSFET, and a various types of a MESFET, each of which has the band bending.

Figure 6:
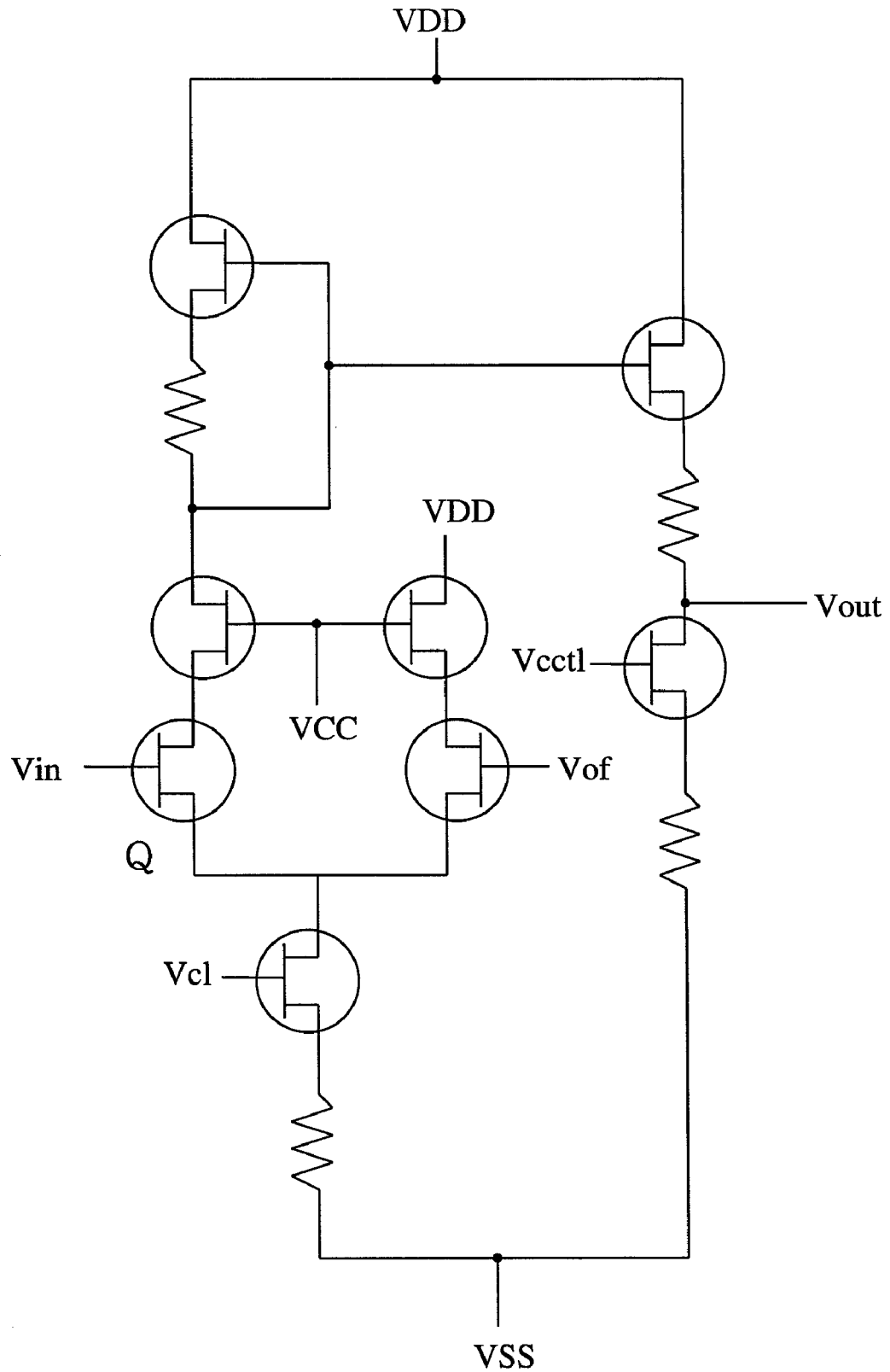
FIG. 6 shows a reading-out circuit which has a transistor of which low frequency noise is reduced and which is operated at cryogenic temperatures.

FIG. 6 shows a reading-out circuit which has the GaAs JFET. In FIG. 6, the reading-out circuit comprises an operational amplifier which has the GaAs JFET Q as a first stage FET. The reading-out circuit is equipped on a ground observation apparatus for astronomy or a observation satellite for astronomy. In this case, observed sub-mill waves are inputted to a gate electrode of the first stage GaAs JFET Q as an input voltage Vin. At that time, in the present invention, the predetermined light is illuminated to the first stage GaAs JFET Q, as described above. Thus, the low frequency noise of the GaAs JFET Q is reduced. Then, the GaAs JFET Q is operated at cryogenic temperatures. As a result, it becomes possible to survey the deep space correctly.

What is claimed is:

1. A method for reducing low frequency noise, the method comprising:

providing a transistor operable at cryogenic temperatures;

supplying power to said transistor at a predetermined temperature to define an activated state of said transistor, wherein said transistor is provided with current in said activated state;

illuminating said transistor with light with said transistor in said activated state; and operating said transistor at said predetermined temperature after illuminating said transistor.

2. A method in accordance with claim 1, wherein, in the step of the illuminating said transistor with said light, photons are illuminated whose energies are less than a band gap energy of a semiconductor which forms a substrate in which the transistor is formed.

3. A method in accordance with claim 2, wherein a wavelength of the light is shorter than a wavelength corresponding to an acceptor level or a donor level of the semiconductor.

4. A method in accordance with claim 1, wherein the transistor has band bending.

5. A method in accordance with claim 4, wherein the band bending is formed in a junction or a depletion layer.

6. A method in accordance with claim 1, wherein the transistor is a GaAs JFET.

* * * * *